US012148859B2

(12) United States Patent
Hwang et al.

(10) Patent No.: US 12,148,859 B2
(45) Date of Patent: Nov. 19, 2024

(54) LIGHT-EMITTING DIODE AND BACKPLANE AND LED DISPLAY INCLUDING THE SAME

(71) Applicant: SAMSUNG ELECTRONICS CO., LTD., Suwon-si (KR)

(72) Inventors: Junsik Hwang, Hwaseong-si (KR); Sungjin Kang, Seoul (KR); Kyungwook Hwang, Hwaseong-si (KR); Junhee Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/144,566

(22) Filed: May 8, 2023

(65) Prior Publication Data

US 2023/0275184 A1 Aug. 31, 2023

Related U.S. Application Data

(63) Continuation of application No. 16/831,194, filed on Mar. 26, 2020, now Pat. No. 11,682,748.

(30) Foreign Application Priority Data

Oct. 22, 2019 (KR) .................... 10-2019-0131594

(51) Int. Cl.
*H01L 33/20* (2010.01)
*H01L 25/075* (2006.01)
(Continued)

(52) U.S. Cl.
CPC .......... *H01L 33/20* (2013.01); *H01L 25/0753* (2013.01); *H01L 33/382* (2013.01); *H01L 33/62* (2013.01)

(58) Field of Classification Search
CPC ... H01L 33/20; H01L 25/0753; H01L 33/382; H01L 33/62; H01L 33/380112; H01L 7/156; H01L 33/0008
See application file for complete search history.

(56) References Cited

U.S. PATENT DOCUMENTS 9,627,596 B2 4/2017 Hong et al.
9,666,561 B2 5/2017 Choi et al.
(Continued)

FOREIGN PATENT DOCUMENTS

KR 10-2013-0075321 A 7/2013
KR 10-1476207 B1 12/2014
(Continued)

OTHER PUBLICATIONS

Communication dated Jul. 1, 2024, issued by the Korean Patent Office in Korean Application No. 10-2019-0131594.

*Primary Examiner* — Su C Kim
(74) *Attorney, Agent, or Firm* — Sughrue Mion, PLLC

(57) ABSTRACT

A light-emitting diode (LED) includes a first semiconductor layer, an active layer, and a second semiconductor layer that are sequentially stacked, and includes a first electrode pad, a second electrode pad and a third electrode pad disposed on the second semiconductor layer in a direction from a corner of the second semiconductor layer to an opposite corner of the second semiconductor layer. An LED includes a first electrode pad disposed at a center of the LED and in contact with a P-type semiconductor layer and a second electrode pad in contact with an N-type semiconductor layer, wherein the second electrode pad is disposed a maximum distance away from the first electrode pad on the same surface.

18 Claims, 17 Drawing Sheets

(51) Int. Cl.
    *H01L 33/38*     (2010.01)
    *H01L 33/62*     (2010.01)

(56)     References Cited

U.S. PATENT DOCUMENTS

| | | |
|---|---|---|
| 9,825,202 B2 | 11/2017 | Schuele et al. |
| 10,297,722 B2 | 5/2019 | Cheng et al. |
| 11,682,748 B2 * | 6/2023 | Hwang .................. H01L 33/20 |
| | | 257/79 |
| 2009/0020769 A1 | 1/2009 | Yoneda et al. |
| 2013/0193464 A1 * | 8/2013 | Bae ...................... H01L 33/405 |
| | | 257/94 |
| 2015/0098224 A1 * | 4/2015 | Hong ........................ F21V 3/10 |
| | | 362/257 |
| 2016/0020353 A1 | 1/2016 | Chu |
| 2016/0260762 A1 | 9/2016 | Ungnapatanin et al. |
| 2017/0103966 A1 * | 4/2017 | Choi ...................... H01L 33/06 |
| 2017/0133550 A1 | 5/2017 | Schuele et al. |
| 2018/0219123 A1 | 8/2018 | Wang et al. |
| 2018/0342653 A1 | 11/2018 | Lee et al. |
| 2019/0137825 A1 | 5/2019 | Kim et al. |

FOREIGN PATENT DOCUMENTS

| | | |
|---|---|---|
| KR | 10-2015-0041344 A | 4/2015 |
| KR | 10-2017-0043118 A | 4/2017 |

\* cited by examiner

LIGHT-EMITTING DIODE AND BACKPLANE AND LED DISPLAY INCLUDING THE SAME

CROSS-REFERENCE TO RELATED APPLICATION

This application is a continuation of U.S. patent application Ser. No. 16/831,194, filed Mar. 26, 2020, in the US Patent and Trademark Office, which application is based on and claims priority under 35 U.S.C. § 119 to Korean Patent Application No. 10-2019-0131594, filed on Oct. 22, 2019, in the Korean Intellectual Property Office, the disclosure of which is incorporated by reference herein in its entirety.

BACKGROUND

1. Field

The disclosure relates to light-emitting devices and related devices, and more particularly, to light-emitting diodes (LEDs) and backplanes and LED displays including the same.

2. Description of Related Art

Recently, displays have been changing from liquid crystal displays (LCDs) that use liquid crystals to light-emitting diode (LED) displays that use LEDs directly as light sources. As an LED is used as a pixel light source, when an LED display is manufactured, a plurality of micro LEDs are transferred to a panel substrate. Through this transfer, the micro LEDs are in electrical contact with each pixel.

SUMMARY

Provided are light-emitting diodes (LEDs) that may ensure a sufficient mounting margin (bonding margin) in applying the LEDs to an LED display.

Provided are LEDs having an electrode structure that may be self-aligned in a mounting process.

Provided are backplanes having a structure that allows self-alignment of the LEDs.

Provided are LED displays including the LEDs and backplanes.

Additional aspects will be set forth in part in the description which follows and, in part, will be apparent from the description, or may be learned by practice of the presented embodiments of the disclosure.

In accordance with an aspect of the disclosure, a light-emitting diode includes a first semiconductor layer; an active layer stacked on the first semiconductor layer; a second semiconductor layer stacked on the active layer; and a first electrode pad, a second electrode pad and a third electrode pad disposed on the second semiconductor layer in a direction from a corner of the second semiconductor layer to an opposite corner of the second semiconductor layer.

The first electrode pad may include a P-type electrode pad, and the second electrode pad and the third electrode pad each may include an N-type electrode pad, and the second electrode pad and the third electrode pad may be symmetrically disposed about the P-type electrode pad.

A height of an upper surface of the first electrode pad may be substantially equal to a height of an upper surface of the second electrode pad and a height of an upper surface of the third electrode pad.

One of the first semiconductor layer and the second semiconductor layer may include a P-type semiconductor layer, the other one of the first semiconductor layer and the second semiconductor layer may include an N-type semiconductor layer, and the active layer may include a layer from which light is emitted.

In accordance with an aspect of the disclosure, a light-emitting diode (LED) includes a first electrode pad disposed at a center of the LED and in contact with a P-type semiconductor layer; and a second electrode pad in contact with an N-type semiconductor layer, wherein the first electrode pad and the second electrode pad are disposed on a same surface, and wherein the second electrode pad is disposed a maximum distance away from the first electrode pad on the same surface.

The light-emitting diode may further include a third electrode pad in contact with the N-type semiconductor layer.

The third electrode pad may be provided on the same surface at a position symmetrical to the second electrode pad with respect to the first electrode pad.

The first electrode pad, the second electrode pad and the third electrode pad may be disposed on a line from a corner of the same surface to an opposite corner of the same surface.

A height of an upper surface of the first electrode pad may be substantially equal to a height of an upper surface of the second electrode pad and a height of an upper surface of the third electrode pad.

In accordance with an aspect of the disclosure, a light-emitting includes an N-type semiconductor layer; an active layer stacked on the N-type semiconductor layer; a P-type semiconductor layer stacked on the active layer; a first trench that penetrates through the P-type semiconductor layer and the active layer and extends to a portion of the N-type semiconductor layer; a second trench that penetrates through the P-type semiconductor layer and the active layer at a position separated from the first trench and extends to another portion of the N-type semiconductor layer; an insulating layer covering walls of the first trench and the second trench, the insulating layer covering an upper surface of the P-type semiconductor layer and respective side surfaces of each of the P-type semiconductor layer, the active layer, and the N-type semiconductor layer; a through hole exposing an upper surface of the P-type semiconductor layer, the through hole penetrating the insulating layer formed on the upper surface of the P-type semiconductor layer between the first trench and the second trench; a first electrode pad that fills the through hole and that is in contact with the P-type semiconductor layer; a second electrode pad that fills the first trench and that is in contact with the N-type semiconductor layer; and a third electrode pad that fills the second trench and that is in contact with the N-type semiconductor layer, wherein the first electrode pad, the second electrode pad and the third electrode pad are arranged in a direction from a corner of the light-emitting diode to an opposite corner of the light-emitting diode.

In accordance with an aspect of the disclosure, a light-emitting diode includes an N-type semiconductor layer; an active layer stacked on the N-type semiconductor layer; a P-type semiconductor layer stacked on the active layer; a trench that penetrates through the P-type semiconductor layer and the active layer and extends to a portion of the N-type semiconductor layer; an insulating layer covering each of a wall of the trench, an upper surface of the P-type semiconductor layer and respective side surfaces of each of the P-type semiconductor layer, the active layer, and the N-type semiconductor layer; a first through hole penetrating through a first portion of the insulating layer covering the upper surface of the P-type semiconductor layer, the first through hole provided on a first side of the trench; a second through hole penetrating through a second portion of the insulating layer covering the upper surface of the P-type semiconductor layer, the second through hole provided on a second side of the trench opposite to the first side; a first electrode pad that fills the trench and that is in contact with the N-type semiconductor layer; a second electrode pad that fills the first through hole and that is in contact with the P-type semiconductor layer; and a third electrode pad that fills the second through hole and that is in contact with the P-type semiconductor layer, wherein the first electrode pad, the second electrode pad and the third electrode pad are arranged in a direction from a corner of the light-emitting diode to an opposite corner of the light-emitting diode.

In accordance with an aspect of the disclosure, a light-emitting diode includes an N-type semiconductor layer; an active layer stacked on the N-type semiconductor layer; a P-type semiconductor layer stacked on the active layer; a trench that penetrates through the P-type semiconductor layer and the active layer and extends to a portion of the N-type semiconductor layer; an insulating layer covering each of a wall of the trench, an upper surface of the P-type semiconductor layer and respective side surfaces of each of the P-type semiconductor layer, the active layer, and the N-type semiconductor layer; a through hole penetrating through a portion of the insulating layer covering the upper surface of the P-type semiconductor layer, the through hole provided on a side of the trench; a first electrode pad that fills the trench and that is in contact with the N-type semiconductor layer; a second electrode pad that fills the through hole and that is in contact with the P-type semiconductor layer, wherein the first electrode pad and the second electrode pad are arranged in a direction from a corner of the light-emitting diode to an opposite corner of the light-emitting diode.

The light-emitting diode may further include a dummy electrode pad disposed at a position symmetrical to one of the first electrode pad and the second electrode pad with the other one of the first electrode pad and the second electrode pad disposed at a center between the dummy electrode pad and the one of the first electrode pad and the second electrode pad, wherein the first electrode pad, the second electrode pad, and the dummy electrode pad are disposed in the direction.

In accordance with an aspect of the disclosure, a backplane includes a substrate comprising a plurality of pixel regions; and a mold surrounding each of the plurality of pixel regions, wherein each pixel region from among the plurality of pixel regions of the substrate includes a first bonding pad on a center of the pixel region; and a second bonding pad that is separated from the first bonding pad and that has a plurality of bonding regions disposed in a direction from a corner of the pixel region to an opposite corner of the pixel region.

The second bonding pad may be configured to surround the first bonding pad.

Each pixel region from among the plurality of pixel regions may include four corners, and each bonding region from among the plurality of bonding regions of the second bonding pad may be positioned at a respective corner of the four corners of the pixel region.

The plurality of bonding regions in the four corners of the pixel region may be connected to each other.

Each pixel region from among the plurality of pixel regions may correspond to a respective mold region of the mold, and each mold region of the mold may include a plurality of side walls inclined with respect to a normal direction perpendicular to a surface of the substrate.

The first bonding pad may include an N-type electrode pad or a P-type electrode pad.

The second bonding pad may include an N-type electrode pad or a P-type electrode pad.

In accordance with an aspect of the disclosure, a backplane includes a substrate; a mold provided on the substrate to define a plurality of pixel regions; a first bonding pad provided at a center of each pixel region from among the plurality of pixel regions; and a second bonding pad separated from the first bonding pad in each pixel region from among the plurality of pixel regions, wherein for each pixel region from among the plurality of pixel regions, the second bonding pad surrounds the first bonding pad, is continuously disposed along a boundary of three edges of the pixel region, and comprises a plurality of bonding regions for bonding a device such that a bonding region from among the plurality of bonding regions is disposed in each corner of four corners of the pixel region; and wherein each bonding region from among the plurality of bonding regions in the second bonding pad is wider than other regions of the second bonding pad and comprises a portion protruding toward the first bonding pad.

A light-emitting diode (LED) display may include a substrate comprising a plurality of pixel regions; a mold surrounding each pixel region from among the plurality of pixel regions; and the light-emitting diode in accordance with an above-noted aspect of the disclosure, mounted in and bonded to a respective pixel region of the substrate to emit light, wherein each pixel region from among the plurality of pixel regions of the substrate includes a first bonding pad on a center of the pixel region; and a second bonding pad that is separated from the first bonding pad and that has a plurality of bonding regions disposed in a direction from a corner of the pixel region to an opposite corner of the pixel region.

In accordance with an aspect of the disclosure, a light-emitting diode (LED) display includes a substrate including a display driving circuit unit and a plurality of pixel regions electrically connected to the display driving circuit unit; a first bonding pad formed on a center of each pixel region from among the plurality of pixel regions; a second bonding pad formed in each pixel region from among the plurality of pixel regions, the second bonding pad being separated from the first bonding pad; an LED that is mounted in each pixel region from among the plurality of pixel regions and that comprises a first electrode pad in contact with the first bonding pad and a second electrode pad in contact with the second bonding pad; and a mold surrounding each pixel region from among the plurality of pixel regions, wherein for each pixel region from among the plurality of pixel regions, the second bonding pad surrounds the first bonding pad and comprises a plurality of bonding regions, and for each pixel region from among the plurality of pixel regions, the first electrode pad and the second electrode pad are disposed in a direction from a corner of the pixel region to an opposite corner of the pixel region.

For each pixel region from among the plurality of pixel regions, the LED may further include a third electrode pad that is separated from the second electrode pad and that is in contact with the second bonding pad, and the first electrode pad, the second electrode pad and the third electrode pad may be disposed in the direction.

The third electrode pad may include a dummy electrode pad.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
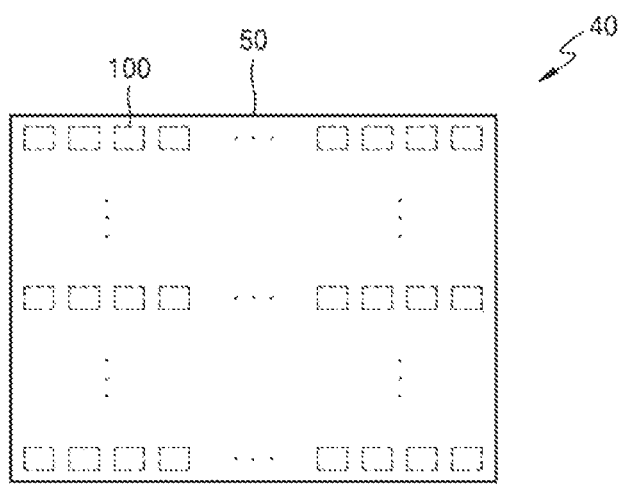
FIG. 1 is a schematic plan view of a light-emitting diode (LED) display including a micro LED according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a light-emitting diode, a backplane, and a light-emitting diode (LED) display including the same according to an embodiment will be described in detail with reference to the accompanying drawings. The light-emitting diodes described herein may be micro LEDs that may be used to implement micro LED displays (for example, monitors, televisions, etc.). An area of a micro LED may be, for example, 50 μm×50 μm or less, but is not limited thereto. In the drawings, thicknesses of layers or regions may be somewhat exaggerated for clarity of the specification. The embodiments described below are merely illustrative, and various modifications may be possible from embodiments of the disclosure. In layer structures described below, when an element or layer is referred to as being "on" or "above" another element or layer, the element or layer may be directly on another element or layer or there may be intervening elements or layers.

Figure 2:
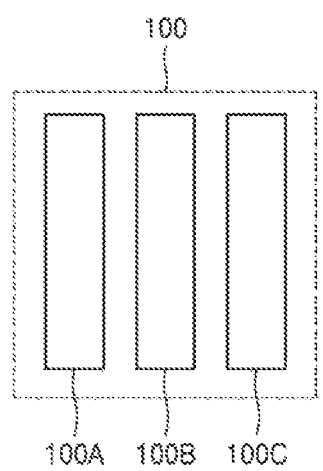
FIG. 2 is an enlarged plan view of one pixel of FIG. 1.

Referring to FIG. 1, a light-emitting diode (LED) display 40 according to an embodiment includes a substrate 50 and a plurality of pixels 100. The plurality of pixels 100 are mounted on the substrate 50 and are regularly arranged in horizontal and vertical directions. The LED display 40 may be a micro LED display. One pixel 100 includes first to third micro LEDs 100A, 100B, and 100C as shown in FIG. 2. One of the first to third micro LEDs 100A, 100B, and 100C may be a micro LED emitting red light, another one may be a micro LED emitting green light, and the other one may be a micro LED emitting blue light. In this way, since the light emitted from the first to third micro LEDs 100A, 100B, and 100C are different from each other, the material and/or structure of a material layer in which the light emission occurs in each micro LED may be different from each other. However, the stacked structure of all material layers constituting each of the micro LEDs 100A, 100B, and 100C may be the same.

All of the first to third micro LEDs 100A, 100B, and 100C may emit the same color light. For example, the first to third micro LEDs 100A, 100B, and 100C may emit any one of red light, green light, and blue light. In this way, when all of the first to third micro LEDs 100A, 100B, and 100C emit the same color of light (for example, blue light), a member for color control or conversion may be placed in front of one or more of the first to third micro LEDs 100A, 100B, and 100C, that is, the plurality of pixels 100. The member may be a color filter, a color converter, or a fluorescent material layer. The color filter may be, for example, a quantum dot color filter or may include a quantum dot color filter.

Figure 3:
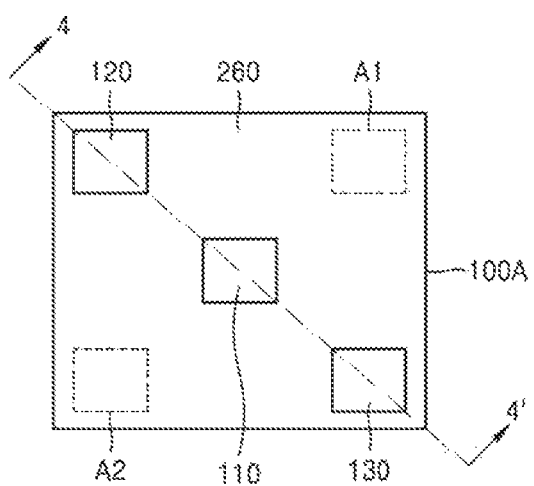
FIG. 3 is a plan view of a micro LED used in an LED display according to an embodiment.

The first to third micro LEDs 100A, 100B, and 100C may be formed by directly implanting or transferring separately made micro-LEDs from the outside to the substrate 50. FIG. 3 is a top view of a micro LED used in the LED display 100 according to an embodiment. The micro LED of FIG. 3 may be any one of the first to third micro LEDs 100A, 100B, and 100C of FIG. 2. For convenience of description, the micro LED of FIG. 3 is regarded as the first micro LED 100A, but the structural features to be described may be equally applied to the second and third micro LEDs 100B and 100C.

Referring to FIG. 3, the first micro LED 100A includes first to third electrode pads 110, 120, and 130 separated from each other. The first to third electrode pads 110, 120, and 130 are arranged in a diagonal direction (i.e., in a direction from one corner of the first micro LED 100A to an opposite corner of the first micro LED 100A). The first electrode pad 110 may be located at the center of an upper surface of the first micro LED 100A. The second electrode pad 120 may be located in an upper left corner, that is, inside the upper left corner of the first micro LED 100A. The third electrode pad 130 may be located at a lower right corner, that is, inside the lower right corner of the first micro LED 100A. The second electrode pad 120 and the third electrode pad 130 may be disposed at other corners, that is, first and second regions A1 and A2, respectively. For example, the second electrode pad 120 may be disposed in the first region A1 and the third electrode pad 130 may be disposed in the second region A2. Regardless of where the second and third electrode pads 120 and 130 are located, the second and third electrode pads 120 and 130 may be located at the most distant locations from the first electrode pad 110 on the upper surface of the first micro LED 100A. An insulating layer 260 is between the first to third electrode pads 110, 120, and 130. Each of the first to third electrode pads 110, 120, and 130 is surrounded by the insulating layer 260. In an example, the first electrode pad 110 may be a P-type electrode pad contacting a P-type semiconductor layer of the first micro LED 100A. In another example, the first electrode pad 110 may be an N-type electrode pad contacting an N-type semiconductor layer of the first micro LED 100A. The second and third electrode pads 120 and 130 may be electrode pads having polarities opposite to those of the first electrode pad 110. For example, when the first electrode pad 110 is a P-type electrode pad, the second and third electrode pads 120 and 130 may be N-type electrode pads. As another example, when the first electrode pad 110 is an N-type electrode pad, the second and third electrode pads 120 and 130 may be P-type electrode pads. As still another example, one of the second and third electrode pads 120 and 130 may be an isolated dummy electrode pad without being electrically connected to other layers of the first micro LED 100A.

Figure 4:
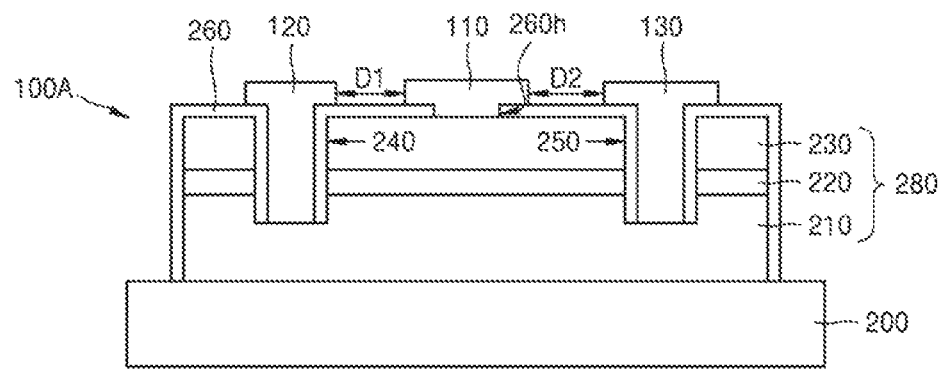
FIG. 4 is a cross-sectional view taken along a direction 4-4' of FIG. 3 and shows a micro LED according to an embodiment.

FIG. 4 is a cross-sectional view taken along a broken line in a direction 4-4' of FIG. 3 and shows a first micro LED according to a first embodiment.

Referring to FIG. 4, the first micro LED 100A includes a stack 280 and an insulating layer 260 sequentially formed on a substrate 200 and first to third electrode pads 110, 120, and 130 provided on the insulating layer 260 and the stack 280.

In detail, a first material layer 210, a second material layer 220, and a third material layer 230 are sequentially stacked on the substrate 200. The first material layer 210 may be or include a first semiconductor layer. The first semiconductor layer may include an N-type semiconductor layer or a P-type semiconductor layer. The N-type semiconductor layer may include, for example, an N-doped compound semiconductor layer. The P-type semiconductor layer may include, for example, a P-doped compound semiconductor layer. The second material layer 220 may be an active layer. The second material layer 220 may be a light-emitting layer that emits light according to combination of electrons and holes or may include the light-emitting layer. For example, the second material layer 220 may include a multi-quantum well (MQW) layer. The third material layer 230 may be or include a second semiconductor layer. The second semiconductor layer may be a P-type semiconductor layer or an N-type semiconductor layer. One of the first and second material layers 210 and 230 may be a P-type semiconductor layer, and the other may be an N-type semiconductor layer. A first trench 240 and a second trench 250 are formed in the stack 280 that includes the first to third material layers 210, 220, and 230. The first trench 240 and the second trench 250 are separated from each other. As shown in FIG. 4, the first electrode pad 110 is disposed between the first trench 240 and the second trench 250. The first trench 240 penetrates through the second and third material layers 220 and 230 and extends to a portion of the first material layer 210. The second trench 250 is also formed in the same form as the first trench 240 and may extend to another portion of the first material layer 210. Side surfaces of the first to third material layers 210, 220, and 230 exposed by the first and second trenches 240 and 250 are covered with the insulating layer 260. The insulating layer 260 may include an oxide layer or a nitride layer, or may include a layer formed of another insulating material. The insulating layer 260 covers walls of the first and second trenches 240 and 250, that is, inner side surfaces of the first and second trenches 240 and 250. However, the insulating layer 260 does not fill the first and second trenches 240 and 250. The insulating layer 260 extends across a surface of the third material layer 230. A through hole 260h is provided between the first and second trenches 240 and 250. The through hole 260h penetrates through the insulating layer 260. The third material layer 230 is exposed through the through hole 260h. The insulating layer 260 covers an entire upper surface of the third material layer 230 around the first and second trenches 240 and 250 and around the through hole 260h. The insulating layer 260 may cover both sides of the stack 280 by extending to both sides thereof. The second electrode pad 120 filling the first trench 240 is formed on the insulating layer 260. The second electrode pad 120 is in contact with the first material layer 210 exposed by the first trench 240. A surface of the first material layer 210 directly contacting the second electrode pad 120 becomes a bottom of the first trench 240. Also, the third electrode pad 130 filling the second trench 250 is formed on the insulating layer 260. The third electrode pad 130 is in contact with the first material layer 210 exposed by the second trench 250. A surface of the first material layer 210 directly contacting the third electrode pad 130 becomes a bottom of the second trench 250. The first electrode pad 110 filling the through hole 260h is provided on the insulating layer 260 between the second and third electrode pads 120 and 130. The first electrode pad 110 is in direct contact with the third material layer 230 through the through hole 260h.

The first to third electrode pads 110, 120, and 130 may be formed at the same time after the contact hole 260h is formed. The first to third electrode pads 110, 120, and 130 may include the same material. The first electrode pad 110 may include a material different from that of the second and third electrode pads 120 and 130. In the latter case, the formation time of the first electrode pad 110 may be different from the formation time of the second and third electrode pads 120 and 130. Upper surfaces of the first to third electrode pads 110, 120, and 130 may have the same height as each other. A distance D1 between the first and the second electrode pads 110 and 120 and a distance D2 between the first and the third electrode pads 110 and 130 may be the same or different from each other. The distances D1 and D2 may be determined considering a gap between a P-type and N-type bonding electrodes provided on a substrate (hereinafter, referred to as a bonding substrate) onto which the first micro LED 100A is to be mounted or, when the first micro LED 100A is bonded to the bonding substrate, gaps between the mold prepared for self-alignment of the first micro LED 100A and the first micro LED 100A.

The substrate 200 may be removed from the first micro LED 100A of FIG. 4. The first micro LED 100A may refer to the remaining part from which the substrate 200 is removed. When the first micro LED 100A is bonded to the bonding substrate through a mold, the first micro LED 100A may be bonded after the substrate 200 is removed.

Figure 5:
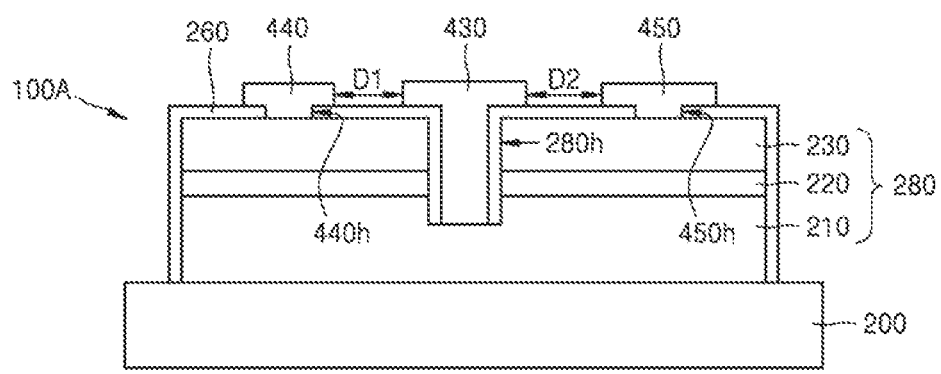
FIG. 5 is a cross-sectional view taken along the direction 4-4' of FIG. 3, and shows a micro LED according to an embodiment.

FIG. 5 is a cross-sectional view taken along a direction 4-4' of FIG. 3 and shows the first micro LED 100A according to a second embodiment. Only parts different from FIG. 4 will be described.

Referring to FIG. 5, a trench 280h penetrating through the second and third material layers 220 and 230 is formed in the stack 280. The trench 280h may be located at the center of the first micro LED 100A or at a position generally referred to as the center. The trench 280h extends to the first material layer 210. Accordingly, the first material layer 210 is exposed through the trench 280h. An exposed portion of the first material layer 210 is a bottom of the trench 280h. The geometry of the trench 280h may be the same as that of the first trench 120 or the second trench 130 of FIG. 4. The trench 280h may be formed in the same manner as the method of forming the first trench 120 or the second trench 130 of FIG. 4. An inner side (wall) of the trench 280h is covered with the insulating layer 260, but the bottom thereof is exposed (i.e., not covered with the insulating layer 260). The trench 280h is filled with a first electrode pad 430. The first electrode pad 430 completely fills the trench 280h and extends onto the upper surface of the insulating layer 260 around the trench 280h by a given length. The first electrode pad 430 contacts the first material layer 210 through the trench 280h. Since the first electrode pad 430 is in contact with the first material layer 210 including the N-type semiconductor layer, the first electrode pad 430 may be an N-type electrode pad. Second and third electrode pads 440 and 450 are positioned on either side of the first electrode pad 430 with the first electrode pad 430 as the center. The second and third electrode pads 440 and 450 are in contact with the third material layer 230 respectively through first and second through holes 440h and 450h respectively passing through first and second portions of the insulating layer 260. Since the second and third electrode pads 440 and 450 are in contact with the third material layer 230 that includes a P-type semiconductor layer, the second and third electrode pads 440 and 450 may be P-type electrode pads. Although the second and third electrode pads 440 and 450 extend on the upper surface of the insulating layer 260 by a given length, the second and third electrode pads 440 and 450 respectively maintain given distances D1 and D2 from the edge of the first electrode pad 430. The first to third electrode pads 430, 440, and 450 are surrounded by the insulating layer 260. The first to third electrode pads 430, 440, and 450 may have the same height as each other.

Figure 6:
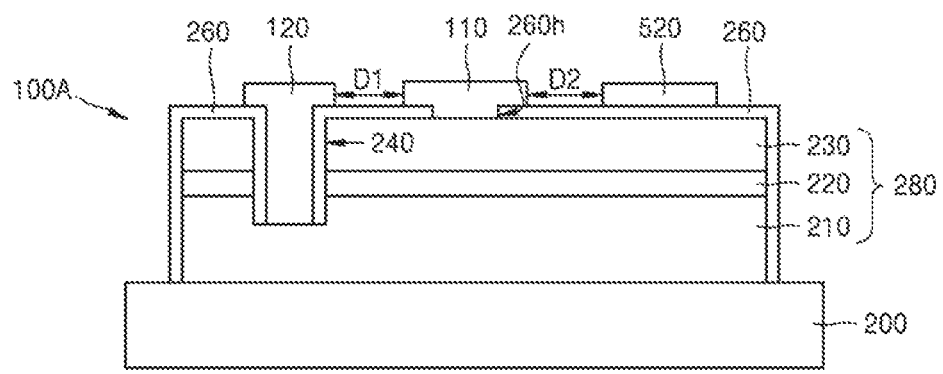
FIG. 6 is a cross-sectional view taken along the direction 4-4' of FIG. 3, and shows a micro LED according to an embodiment.

FIG. 6 is a cross-sectional view taken along the direction 4-4' of FIG. 3 and shows the first micro LED 100A according to a third embodiment. Only parts different from FIG. 4 will be described.

Referring to FIG. 6, the first micro LED 100A does not include the third electrode pad 130 of FIG. 4 and includes a dummy electrode pad 520 in the position of the third electrode pad 130. The dummy electrode pad 520 is positioned entirely on the insulating layer 260. The dummy electrode pad 520 does not contact any of the other material layers included in the first micro LED 100A. Therefore, the dummy electrode pad 520 is completely isolated The dummy electrode pad 520 has the same height as the first and third electrode pads 110 and 130. The dummy electrode pad 520 may be provided for the balance and stability of the first micro LED 100A when the first micro LED 100A is mounted on a backplane, which may be referred to as a display panel substrate. The dummy electrode pad 520 may be, for example, a metal pattern.

The first micro LED 100A illustrated in FIG. 6 may be the same as a case when the third electrode pad 130 and the second trench 250 are omitted from the first micro LED 100A of FIG. 4 and the dummy electrode pad 520 is formed on the insulating layer 260 covering an upper surface of the third material layer 230. In FIG. 6, the position of the second electrode pad 120 may be interchanged with the position of the dummy electrode pad 520. In other words, the dummy electrode pad 520 may be disposed on a left side of the first electrode pad 110, and the second electrode pad 120 may be disposed on a right side of the first electrode pad 110.

Figure 7:
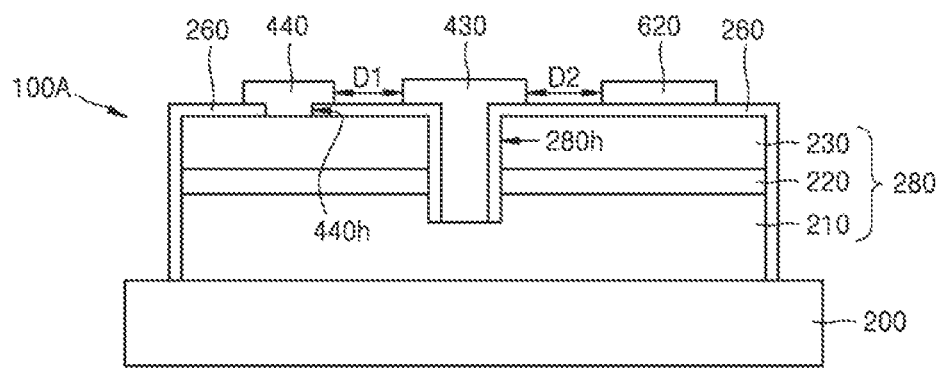
FIG. 7 is a cross-sectional view taken along the direction 4-4' of FIG. 3, and shows a micro LED according to an embodiment.

FIG. 7 is a cross-sectional view taken along the direction 4-4' of FIG. 3 and shows a first micro LED 100A according to a fourth embodiment. Only parts different from FIG. 4 will be described.

Comparing FIG. 5 to FIG. 7, the first micro LED 100A illustrated in FIG. 7 may be the same as a case when the third electrode pad 450 and the through hole 450h are omitted from the first micro LED 100A of FIG. 5 and a dummy electrode pad 620 is formed on the insulating layer 260 covering the upper surface of the third material layer 230. In FIG. 7, the position of the second electrode pad 440 may be interchanged with the position of the dummy electrode pad 620. In other words, the dummy electrode pad 620 may be disposed on a left side of the first electrode pad 430, and the second electrode pad 440 may be disposed on a right side of the first electrode pad 430.

Referring to FIGS. 6 and 7, each of the dummy electrode pads 520 and 620 may be provided to be symmetrical to one of the first and second electrode pads 110 and 120 (or 430 and 440), for example, the first electrode pad 110 (or 430), with the other one of the first and second electrode pads 110 and 120 (or 430 and 440) positioned at the center.

Figure 8:
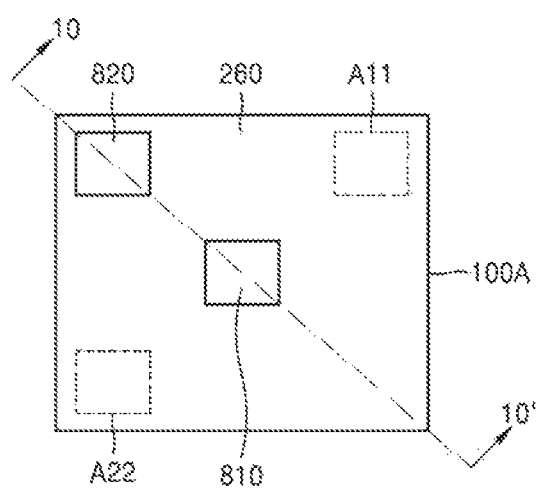
FIGS. 8 and 9 are plan views of micro LEDs used in an LED display according to an embodiment.
Figure 9:
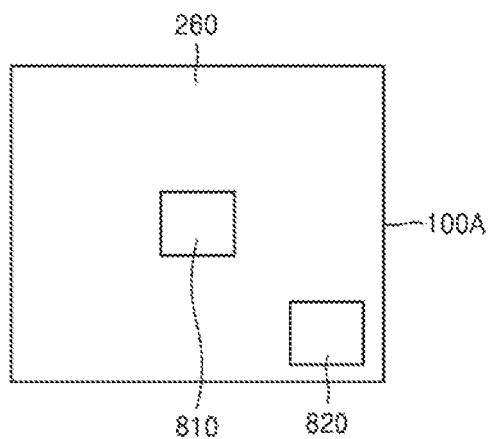

FIG. 8 is a plan view of the first micro LED 100A according to another embodiment. Like reference numerals are used to indicate elements that are substantially identical to the elements described above Referring to FIG. 8, the first micro LED 100A includes first and second electrode pads 810 and 820 that are diagonally disposed. The first and second electrode pads 810 and 820 are surrounded by the insulating layer 260. The first electrode pad 810 may correspond to the first electrode pad 110 of FIG. 3. The second electrode pad 820 may correspond to the second electrode pad 120 of FIG. 3. As shown in FIG. 9, the second electrode pad 820 may be disposed on an opposite side along a diagonal line. In other words, the second electrode pad 820 may be disposed at a position corresponding to the third electrode pad 130 of FIG. 3. In another example, the second electrode pad 820 may be disposed in a first area A11 or a second area A22 as shown in FIG. 8. As shown in FIGS. 8 and 9, the distance between the first and second electrode pads 810 and 820 is maximized when the second electrode pad 820 is disposed at any position in a diagonal direction. In other words, in the first micro LED 100A, the first and second electrode pads 810 and 820 may be disposed to have a maximum possible distance from each other when one of the pads is positioned at the center.

Figure 10:
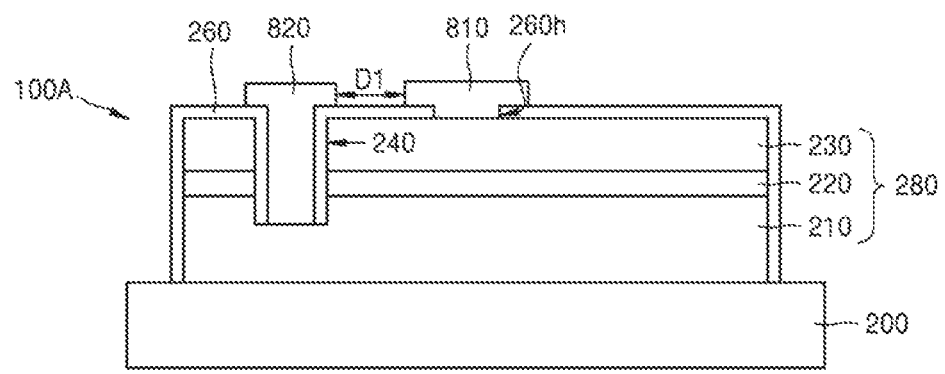
FIG. 10 is a cross-sectional view taken along a direction 10-10' of FIG. 8, and shows a micro LED according to an embodiment.

FIG. 10 is a cross-sectional view taken along a direction 10-10' of FIG. 8 and shows a first micro LED 100A according to an embodiment.

Referring to FIG. 10, the first micro LED 100A may be the same as a case when the third electrode pad 130 and the second trench 250 are omitted from the first micro LED 100A shown in FIG. 4.

Figure 11:
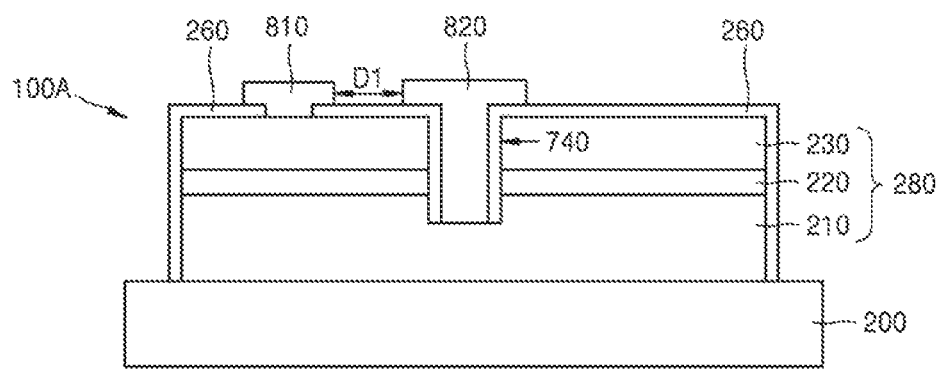
FIG. 11 is a cross-sectional view taken along the direction 10-10' of FIG. 8, and shows a micro LED according to an embodiment.

FIG. 11 is a cross-sectional view taken along the direction 10-10' of FIG. 8 and shows a first micro LED 100A according to another embodiment.

Referring to FIG. 11, the first micro LED 100A may be the same as a case when the third electrode pad 450 and the through hole 450h are omitted from the first micro LED 100A shown in FIG. 5. In other words, in the first micro LED 100A of FIG. 11, the second electrode pad (N-type electrode pad) 820 is disposed at the center, and the first electrode pad (P-type electrode pad) 810 is disposed at a corner in a diagonal direction.

Figure 12:
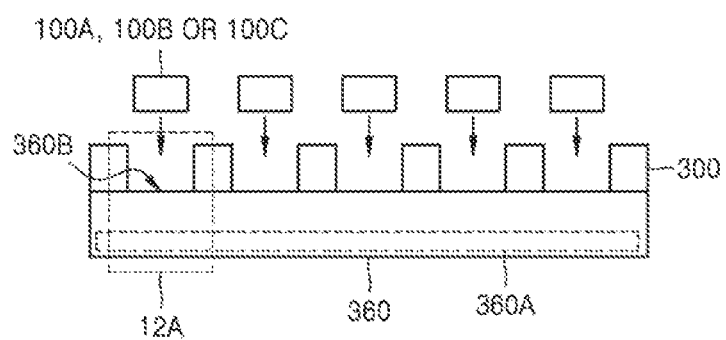
FIG. 12 is a cross-sectional view of a case in which a plurality of micro LEDs are transferred to a display substrate through a mold in a process of manufacturing an LED display according to an embodiment.

FIG. 12 schematically illustrates a case when a plurality of micro LEDs, that is, the first, second, and third micro LEDs 100A, 100B, and 100C, are bonded or mounted to a predetermined position of a substrate 360 through a mold 300 in an LED display according to an embodiment. Here, the determined position may be a pixel position. The substrate 360 may include a circuit unit 360A for driving the LED display. The circuit unit 360A may be electrically connected to a pixel region where a light-emitting device is mounted. The mold 300 and the substrate 360 may be collectively referred to as a backplane.

Referring to FIG. 12, a plurality of micro LEDs, that is, the first, second, and third micro LEDs 100A, 100B, and 100C, respectively are bonded to a plurality of predetermined positions of the substrate 360. In order to guide the bonding of the plurality of micro LEDs, that is, the first, second, and third micro LEDs 100A, 100B, and 100C, the mold 300 is provided on the substrate 360. A surface (for example, an entire upper surface) of the substrate 360 on which the plurality of micro LEDs, that is, the first, second, and third micro LEDs 100A, 100B, and 100C, are to be bonded may be divided into a plurality of bonding regions 360B by the mold 300. The bonding regions 360B may be pixel regions. Each of the bonding regions 360B may have an area on which one micro LED may be bonded. Accordingly, one micro LED, that is, the first, second, or third micro LED 100A, 100B, or 100C, may be bonded to each of the bonding regions 360B divided by the mold 300. Each of the bonding regions 360B may be one sub-pixel region, and one micro LED bonded to each bonding region 360B may be a sub-pixel emitting red light, green light, or blue light.

The plurality of micro LEDs, that is, the first, second, and third micro LEDs 100A, 100B, and 100C, may be supplied on the substrate 360 by a wet transfer method, or may be supplied by a transfer method different from the wet transfer method. As an example of the wet transfer method, a liquid fluid including a plurality of micro LEDs, that is, the first, second, and third micro LEDs 100A, 100B, and 100C, may flow or be sprayed onto the substrate 360 on which the mold 300 is provided. The mold 300 has a structure for guiding the micro LEDs so that one micro LED may be mounted in each of the bonding regions 360B. Accordingly, one micro LED, that is, the first, second, or third micro LED 100A, 100B, or 100C, may be mounted in each bonding region 360B while the liquid fluid flows or is sprayed onto the substrate 360. Reference numeral 12A denotes a unit bonding region. Only one micro LED is bonded in the unit bonding region. Therefore, the unit bonding region may be one sub-pixel region.

Figure 13:
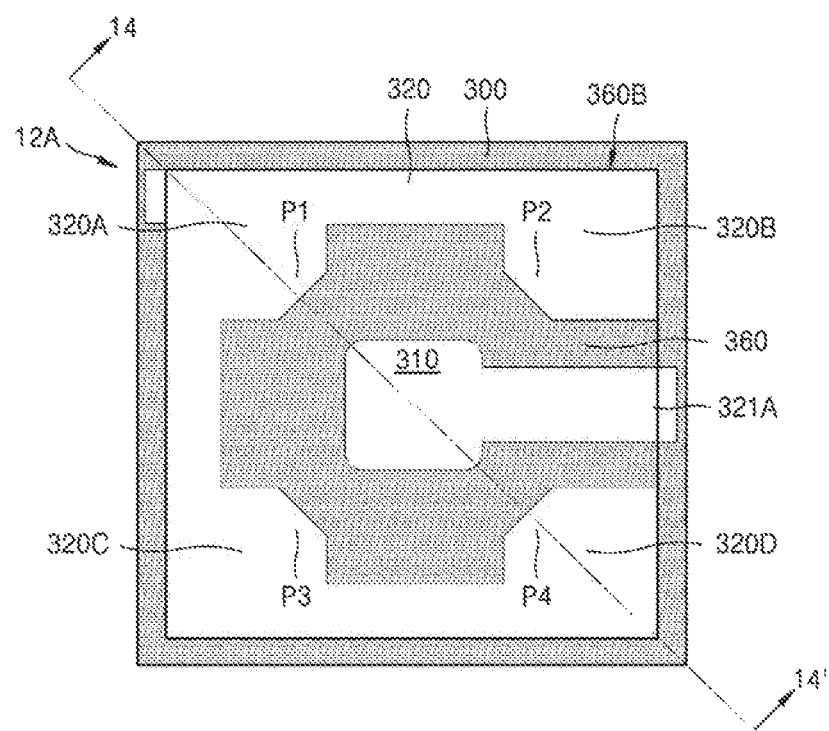
FIG. 13 is an enlarged view of a first region in which one micro LED is transferred in FIG. 12, and is a plan view of a substrate inside a mold in which the micro LEDs are mounted.

FIG. 13 is a view from the top of the unit bonding region of the substrate 360 on which the mold 300 for self-alignment of the first micro LED 100A is provided in a bonding process of the first micro LED 100A.

Referring to FIG. 13, a first bonding pad 310 and a second bonding pad 320 are provided in the bonding region 360B inside the mold 300. The first and second bonding pads 310 and 320 may be conductive pads. The first bonding pad 310 may be located at the center of the bonding region 360B. The center of the mold 300 may coincide with the center of the substrate 360 inside the mold 300. The first bonding pad 310 is a portion to be bonded to the first electrode pads 110, 430, and 810 of the first micro LED 100A. A wire 321A connected to a power source is connected to the first bonding pad 310. The second bonding pad 320 is separated from the first bonding pad 310. The second bonding pad 320 is electrically insulated from the first bonding pad 310. The second bonding pad 320 surrounds the first bonding pad 310 except for a portion where the wire 321A of the first bonding pad 310 is disposed. The second bonding pad 320 is continuously disposed along a boundary of the pixel region defined by the mold 300, for example, along the boundary of three surfaces (i.e., edges) of the pixel region. Although described herein as a pixel region for convenience, the pixel region defined by the mold 300 shown in FIG. 13 may be practically a sub-pixel region to which one micro LED is bonded. The second bonding pad 320 may include first to fourth bonding regions 320A, 320B, 320C, and 320D provided at four corners of the substrate 360 inside the frame 300. As shown in FIG. 13, an area of the first to fourth bonding regions 320A to 320D in the second bonding pad 320 may be relatively greater than other areas within the second bonding pad 320, for example, areas between the first to fourth bonding regions 320A to 320D. The first to fourth bonding regions 320A to 320D are regions in contact with the second and third electrode pads 120 and 130 or 440 and 450 of the first micro LED 100A. The first to fourth bonding regions 320A, 320B, 320C, and 320D respectively may have portions P1 to P4 protruding toward the first bonding pad 310. When the first micro LED 100A has an electrode pad configuration as shown in FIG. 6 or 7, the first to fourth bonding regions 320A to 320D may contact one electrode pad 120 or 440 and one dummy electrode pad 520 or 620. Also, when the first micro LED 100A has an electrode pad configuration as shown in FIGS. 8 to 11, the first to fourth bonding regions 320A to 320D may contact one electrode pad, that is, the first or second electrode pad 810 or 820, disposed in a corner of the first micro LED 100A in a diagonal direction.

In this way, the second bonding pad 320 respectively has bonding regions, that is, the first to fourth bonding regions 320A to 320D, at four corners with the first bonding pad 310 as the center. It is possible that the first micro LED 100A is rotated or twisted in any direction in a process of mounting the first micro LED 100A including the electrode pads aligned as shown in FIG. 3, FIG. 8, or FIG. 9 on the mold 300. But as long as the electrode pads, that is, the first electrode pad 110, the second electrode pad 120, the third electrode pad 130, the first electrode pad 810, or the second electrode pad 820, included in the first micro LED 100A face the substrate 360 inside the mold 100, the first electrode pad 110 or 810 of the first micro LED 100A may contact the first bonding pad 310 inside the mold 300. Further, the second electrode pad 120 and/or the third electrode pad 130, or the second electrode pad 820 may surely contact one of the first to fourth bonding regions 320A to 320D of the second bonding pad 320. As described above, the reason why the first micro LED 100A is self-mounted or self-bonded is because two or more electrode pads, that is, the first electrode pad 110, the second electrode pad 120, the third electrode pad 130, or the first and second electrode pads 810 and 829, are on the same surface of the first micro LED 100A in a diagonal direction.

Figure 14:
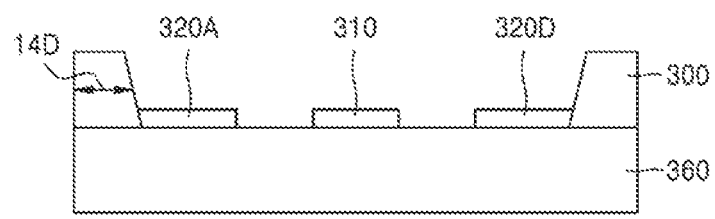
FIG. 14 is a cross-sectional view taken along a line 14-14' of FIG. 13.

FIG. 14 is a cross-sectional view taken along a line 14-14' of FIG. 13, that is, the unit bonding region 12A in a diagonal direction.

Referring to FIG. 14, a mold region of the mold 300 to guide self-alignment bonding of the first micro LED 100A is provided on both edges of the substrate 360. Inner side surfaces (i.e., side walls) of the mold 300 are inclined to facilitate receiving of the micro LED. The inclined surface may be inclined with respect to a normal direction perpendicular to a surface of the substrate 360. A width 14D of the mold 300 gradually increases toward the substrate 360. The first bonding pad 310 is at the center of the substrate 360 inside the mold 300. The first bonding region 320A of the second bonding pad 320 is on a left side, and the fourth bonding region 320D of the second bonding pad 320 is on a right side of the first bonding pad 310.

Figure 15:
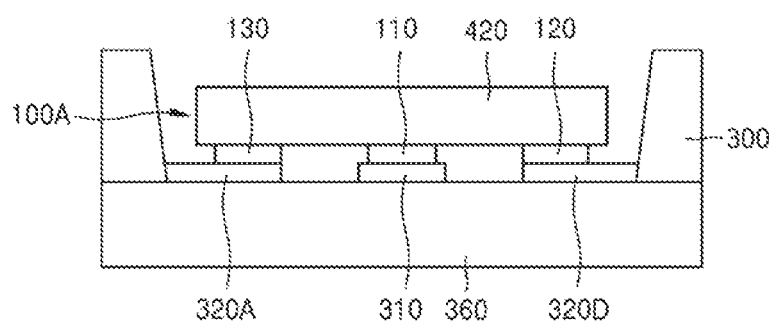
FIG. 15 is a cross-sectional view of a case in which micro LEDs are correctly aligned and mounted on a substrate.

FIG. 15 is a cross-sectional view of a case in which the first micro LED 100A is normally mounted (bonded) on the substrate 360 inside the mold 300 of FIG. 14.

Referring to FIG. 15, the first electrode pad 110 of the first micro LED 100A contacts the first bonding pad 310 inside the mold 300. The third electrode pad 130 of the first micro LED 100A contacts the first bonding region 320A of the second bonding pad 320 inside the mold 300. Also, the second electrode pad 120 of the first micro LED 100A contacts the fourth bonding region 320D of the second bonding pad 320 inside the mold 300.

Reference numeral 420 indicates a body including the stack 280 and the insulating layer 260 of the first micro LED 100A. In FIG. 15, one of the second and third electrode pads 120 and 130 may be a dummy electrode pad.

Figure 16:
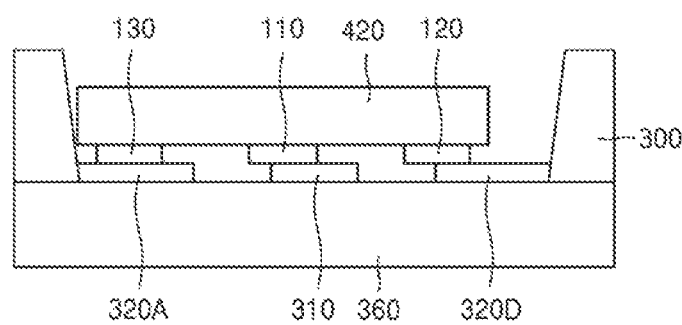
FIG. 16 is a cross-sectional view of a case in which a micro LED is mounted to the left in FIG. 15.
Figure 17:
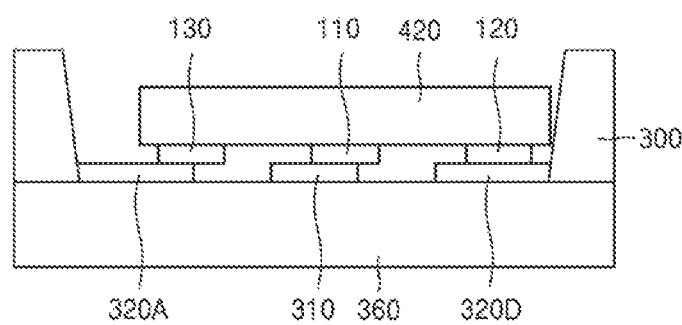
FIG. 17 is a cross-sectional view of a case in which a micro LED is mounted to the right in FIG. 15.

FIG. 16 illustrates a case in which the first micro LED 100A is mounted to the left side, and FIG. 17 illustrates a case in which the first micro LED 100A is mounted to the right side.

Referring to FIGS. 16 and 17, as long as the first micro LED 100A is introduced into the mold 300 while maintaining a normal bonding direction, although the first micro LED 100A is bonded to the left or the right unlike in FIG. 15, the first to third electrode pads 110, 120, and 130 of the first micro LED 100A may still contact the corresponding bonding pads on the substrate 360 inside the mold 300.

In this way, even when the first micro LED 100A is mounted to one side, the first to third electrode pads 110, 120, and 130 may contact the corresponding bonding pads. Accordingly, a temperature and pressure applied to the first micro LED 100A in a bonding process, for example, a eutectic bonding process may be uniformly and entirely applied to the first micro LED 100A. Accordingly, the first micro LED 100A may be stably balanced in the bonding process. The bonding process may be a direct contact bonding method in which the first to third electrode pads 110, 120, and 130 and the bonding pads, that is, the first and second bonding pads 310 and 320, are in direct contact, or an indirect contact bonding method in which a contact member (for example, solder ball) is used between the first to third electrode pads 110, 120, and 130, and the bonding pads, that is, the first and second bonding pads 310 and 320.

A light-emitting diode according to an embodiment includes one center electrode pad and two electrode pads disposed around the center electrode pad on the same surface. The center electrode pad may include a P-type electrode pad or an N-type electrode pad. The center electrode pad may have a polarity opposite to polarities of the two electrode pads disposed around the center. The two electrode pads are symmetrically distributed with the center electrode pad as the center. The three electrode pads are arranged in a diagonal direction on the same surface so that a distance between the center electrode pad and the two electrode pads on the same surface is maximum. Accordingly, a sufficient margin may be ensured in a process of mounting (bonding) the light-emitting diode, and the mounting margin is increased, and thus, the mounting (bonding) is easy compared to the related art, and the failure rate of mounting may be reduced.

Also, when the size of the light-emitting diode is reduced, a sufficient bonding margin (bonding interval) may be ensured even when the degree of integration of the light-emitting diode array is increased.

Also, a temperature and pressure applied to the light-emitting diode in a bonding process, for example, a eutectic bonding process, may be uniformly distributed on the entire light-emitting diode, and thus, the stability of the light-emitting diode may be increased during the bonding process.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light-emitting diode comprising:
   a first semiconductor layer;
   an active layer stacked on the first semiconductor layer;
   a second semiconductor layer stacked on the active layer; and
   a first electrode pad, a second electrode pad and a third electrode pad disposed on the second semiconductor layer in a direction from a corner of the second semiconductor layer to an opposite diagonal corner of the second semiconductor layer,
   wherein the second electrode pad is located in the corner of the second semiconductor layer, and the third electrode pad is located in the opposite diagonal corner of the second semiconductor layer,
   and wherein one of the second electrode pad and the third electrode pad comprises a dummy electrode pad, and
   wherein the dummy electrode pad is spaced apart from the second semiconductor layer,
   wherein thicknesses of the first to third electrode pads are different from each other.

2. The light-emitting diode of claim 1, wherein the first electrode pad comprises a P-type electrode pad,
   wherein the second electrode pad and the third electrode pad each comprise an N-type electrode pad, and
   wherein the second electrode pad and the third electrode pad are symmetrically disposed about the P-type electrode pad.

3. The light-emitting diode of claim 1, wherein a height of an upper surface of the first electrode pad is substantially equal to a height of an upper surface of the second electrode pad and a height of an upper surface of the third electrode pad.

4. The light-emitting diode of claim 1, wherein one of the first semiconductor layer and the second semiconductor layer comprises a P-type semiconductor layer, the other one of the first semiconductor layer and the second semiconductor layer comprises an N-type semiconductor layer, and the active layer comprises a layer from which light is emitted.

5. The light-emitting diode of claim 1, wherein one of the first and second electrode pads is in contact with the first semiconductor layer by penetrating through the second semiconductor layer and the active layer and the other one of the first and second electrode pads is in contact with the second semiconductor layer.

6. The light-emitting diode of claim 5, wherein the one of the first and second electrode pads has a portion penetrating through the second semiconductor layer and the active layer, and wherein an insulating layer is between the portion and the second semiconductor layer and the active layer.

7. The light-emitting diode of claim 1, further comprising an insulating layer between the dummy electrode pad and the second semiconductor layer.

8. The light-emitting diode of claim 7, wherein the insulating layer is extended on the second semiconductor layer between the first electrode pad, the second electrode pad, and the third electrode pad.

9. The light-emitting diode of claim 1, wherein the first semiconductor layer, the active layer, and the second semiconductor layer are sequentially stacked on a substrate, and
wherein a distance between the substrate and the first electrode pad is different from a distance between the substrate and the other one of the second electrode pad and the third electrode pad.

10. The light-emitting diode of claim 1, wherein upper surface areas of the first to third electrode pads are the same or different from each other.

11. A light-emitting diode comprising:
an N-type semiconductor layer;
an active layer stacked on the N-type semiconductor layer;
a P-type semiconductor layer stacked on the active layer;
a trench that penetrates through the P-type semiconductor layer and the active layer and extends to a portion of the N-type semiconductor layer;
a through hole configured to expose the P-type semiconductor layer, the through hole provided on a side of the trench;
a first electrode pad that is in contact with the N-type semiconductor layer via the trench;
a second electrode pad that is in contact with the P-type semiconductor layer via the through hole, and
a dummy electrode pad,
wherein the first electrode pad, the second electrode pad, and the dummy electrode pad are arranged in a direction from a corner of the light-emitting diode to an opposite diagonal corner of the light-emitting diode, and
wherein the second electrode pad is located in the corner of the light emitting diode, and the dummy electrode pad is located in the opposite diagonal corner of the light emitting diode, and wherein the dummy electrode pad is spaced apart from the P-type semiconductor layer,
wherein thicknesses of the first, second and dummy electrode pads are different from each other.

12. The light-emitting diode of claim 11, wherein the dummy electrode pad is disposed at a position symmetrical to one of the first electrode pad and the second electrode pad with the other one of the first electrode pad and the second electrode pad disposed at a center between the dummy electrode pad and the one of the first electrode pad and the second electrode pad.

13. The light-emitting diode of claim 11, wherein upper surface areas of the first electrode pad, the second electrode pad, and the dummy electrode pad are the same or different from each other.

14. The light-emitting diode of claim 11, further comprising an insulating layer between the dummy electrode pad and the P-type semiconductor layer.

15. The light-emitting diode of claim 14, wherein the insulating layer is extended on the P-type semiconductor layer between the first electrode pad, the second electrode pad, and the dummy electrode pad.

16. The light-emitting diode of claim 15, wherein the insulating layer is extended in the trench to prevent the first electrode pad from being in contact with the P-type semiconductor layer and the active layer.

17. A light-emitting diode (LED) display comprising:
a substrate comprising a plurality of pixel regions;
a mold surrounding each pixel region from among the plurality of pixel regions; and
a light-emitting diode mounted in and bonded to a respective pixel region of the substrate to emit light, wherein the light-emitting diode comprises:
a first semiconductor layer;
an active layer stacked on the first semiconductor layer;
a second semiconductor layer stacked on the active layer; and
a first electrode pad, a second electrode pad and a third electrode pad disposed on the second semiconductor layer in a direction from a corner of the second semiconductor layer to an opposite diagonal corner of the second semiconductor layer,
wherein the second electrode pad is located in the corner of the second semiconductor layer, and the third electrode pad is located in the opposite diagonal corner of the second semiconductor layer,
and wherein one of the second electrode pad and the third electrode pad comprises a dummy electrode pad,
wherein the dummy electrode pad is spaced apart from the second semiconductor layer, and
wherein each pixel region from among the plurality of pixel regions of the substrate comprises:
a first bonding pad on a center of the pixel region; and
a second bonding pad that is separated from the first bonding pad and that has a plurality of bonding regions disposed in a direction from a corner of the pixel region to an opposite corner of the pixel region,
wherein thicknesses of the first to third electrode pads are different from each other.

18. The LED display of claim 17, wherein an area of the second bonding pad is larger than an area of the first bonding pad.

* * * * *